United States Patent
Naaman

(10) Patent No.: US 10,650,884 B2
(45) Date of Patent: May 12, 2020

(54) SUPERCONDUCTING MEMORY WITH JOSEPHSON PHASE-BASED TORQUE

(71) Applicant: Microsoft Technology Licensing, LLC, Redmond, WA (US)

(72) Inventor: Ofer Naaman, Santa Barbara, CA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 16/120,882

(22) Filed: Sep. 4, 2018

(65) Prior Publication Data

US 2020/0075093 A1    Mar. 5, 2020

(51) Int. Cl.
*G11C 11/44* (2006.01)
*G11C 11/16* (2006.01)

(52) U.S. Cl.
CPC .......... *G11C 11/44* (2013.01); *G11C 11/1675* (2013.01)

(58) Field of Classification Search
CPC ............................ G11C 11/44; G11C 11/1675
See application file for complete search history.

(56) References Cited

U.S. PATENT DOCUMENTS

| | | | |
|---|---|---|---|
| 9,013,916 B2 | 4/2015 | Naaman et al. | |
| 9,208,861 B2 | 12/2015 | Herr et al. | |
| 9,520,181 B1 | 12/2016 | Miller et al. | |
| 9,646,682 B1 * | 5/2017 | Miller | G11C 7/06 |
| 2015/0094207 A1 | 4/2015 | Herr et al. | |
| 2015/0097159 A1 * | 4/2015 | Apalkov | H01L 43/08 |
| | | | 257/31 |
| 2018/0025775 A1 * | 1/2018 | Ambrose | G11C 11/44 |
| | | | 257/35 |

OTHER PUBLICATIONS

Dayton, et al., "Experimental Demonstration of a Josephson Magnetic Memory Cell with a Programmable π-Junction", In Journal of IEEE Magnetics Letters, vol. 9, Feb. 8, 2018, pp. 1-6.
Konschelle, et al., "Magnetic Moment Manipulation by a Josephson Current", In Journal of Physical Review letters, Jan. 5, 2009, pp. 1-5.
Shukrinov, et al., "Magnetization reversal by superconducting current in φ0 Josephson junctions", In Journal of Applied Physics Letters, vol. 110, Issue 18, May 1, 2017, pp. 1-7.

(Continued)

*Primary Examiner* — Tri M Hoang
(74) *Attorney, Agent, or Firm* — Ranjeev Singh; Singh Law, PLLC

(57) ABSTRACT

Examples described in this disclosure relate to a memory cell with Josephson phase-based torque. In one example, a memory cell including a first inductor and a magnetic Josephson junction (MJJ) coupled to the first inductor to form a loop is provided. The MJJ may include a free magnetic layer formed above a non-magnetic layer, and a fixed magnetic layer below the non-magnetic layer. A first state of the memory cell corresponds to a first magnetization of the free magnetic layer that is parallel to a magnetization of the fixed magnetic layer and the second state of the memory cell corresponds to a second magnetization of the free magnetic layer that is anti-parallel to the magnetization of the fixed magnetic layer. The memory cell is configured to switch from the first state to the second state based on whether the MJJ is in a zero-state or a π-state.

18 Claims, 8 Drawing Sheets

(56) References Cited

OTHER PUBLICATIONS

Waintal, et al., "Magnetic exchange interaction induced by a Josephson current", In Journal of Physical Review B, vol. 65, Issue 5, Jan. 3, 2002, pp. 1-12.
"International Search Report and Written Opinion Issued in PCT Application No. PCT/US2019/038807", dated Sep. 30, 2019, 20 Pages.

* cited by examiner

SUPERCONDUCTING MEMORY WITH JOSEPHSON PHASE-BASED TORQUE

BACKGROUND

Semiconductor based integrated circuits used in electronic devices, such as random-access memories, include digital circuits based on complimentary metal-oxide semiconductor (CMOS) technology. CMOS technology, however, is reaching its limits in terms of the device size. In addition, leakage current in CMOS based memories is causing high power consumption even when these memories are not being accessed.

As an example, servers in a data center are increasingly consuming large amounts of power. The consumption of power is partly the result of power loss from the dissipation of energy even when the CMOS circuits are inactive. This is because even when such circuits, such as random-access memories, are inactive and are not consuming any dynamic power, they still consume power because of the need to maintain the state of CMOS transistors. In addition, because CMOS circuits are powered using DC voltage, there is a certain amount of current leakage even when the CMOS circuits are inactive. Thus, even when such circuits are not processing operations, such as read/write, power is wasted not only as a result of the requirement to maintain the state of the CMOS transistors, but also as a result of the current leakage.

An alternative approach to CMOS technology-based memory is a superconducting logic-based memory.

SUMMARY

In one example, the present disclosure relates to a memory cell including a first inductor and a magnetic Josephson junction (MJJ) coupled to the first inductor to form a loop. The MJJ may include at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and where the memory cell is configured to switch from the first state of the memory cell to the second state of the memory cell responsive to a current flowing through the MJJ based on whether the MJJ is in a zero-state or a π-state, where the current flowing through the MJJ is configured to exert a torque on the magnetization of the free magnetic layer to cause the switch from the first state of the memory cell to the second state of the memory cell, and, where the current is produced in response to an application of flux to the loop via the first inductor.

In another aspect, a method in a memory cell including a first inductor and a magnetic Josephson junction (MJJ) connected to the first inductor to form a loop, where the MJJ comprises at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second state corresponds to a second configuration of magnetization of the free magnetic layer, where the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer is provided. The method may include receiving a write pulse via a write-bit line. The method may further include in response to a current flowing through the MJJ, switching from the first state of the memory cell to the second state of the memory cell based on whether the MJJ is in a zero-state or a π-state, where the current flowing through the MJJ is configured to exert a torque on the magnetization of the free magnetic layer to cause the switching from the first state of the memory cell to the second state of the memory cell, and where the current is produced in response to an application of flux to the loop via the first inductor.

In yet another aspect, the present disclosure relates to a memory cell including a first inductor and a magnetic Josephson junction (MJJ). The MJJ may include at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second state corresponds to a second configuration of magnetization of the free magnetic layer, where the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and where the memory cell is configured to switch from the first state of the memory cell to the second state of the memory cell based on a torque exerted on the magnetization of the free magnetic layer responsive to whether the MJJ is in a zero-state or a π-state.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. As an example, the terms such as the first layer, the second layer, and the third layer are merely used to indicate that there is at least one free magnetic layer on one side of at least one fixed magnetic layer and at least one free magnetic layer on the other side of the at least one fixed magnetic layer. These terms do not imply a specific arrangement or a particular order of creating these layers.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
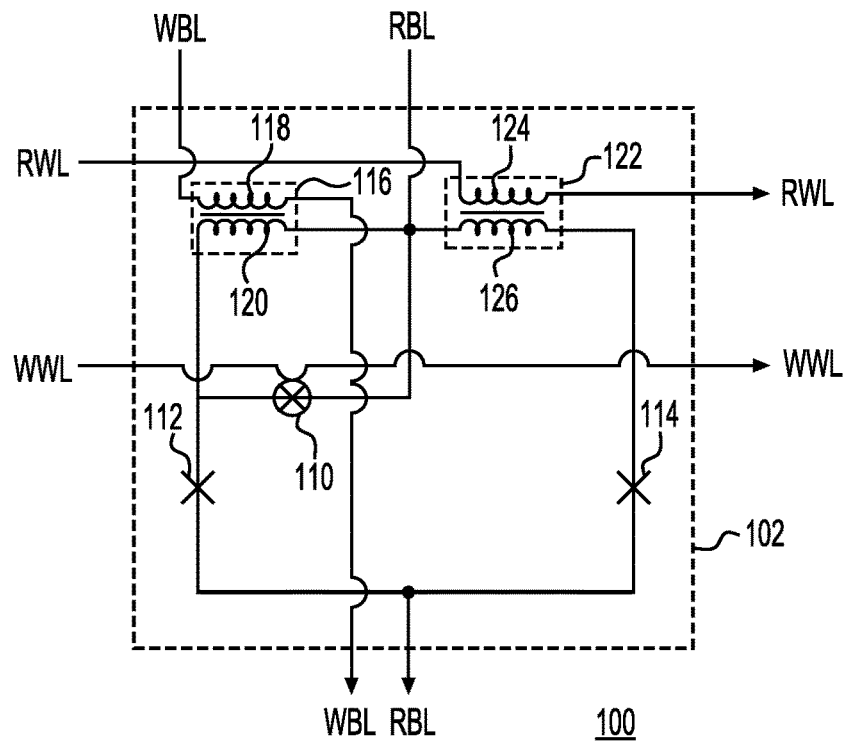
FIG. 1 shows a diagram of a memory cell in accordance with one example.

Examples described in this disclosure relate to superconducting logic-based memory systems, including a superconducting memory with Josephson phase-based torque. Certain examples also relate to Josephson Magnetic Random-Access Memories (JMRAMs) with Josephson phase-based torque. Certain examples further relate to reciprocal quantum logic (RQL) compatible RAMs. Unlike CMOS transistors, the RQL circuits are superconductor circuits that use Josephson junction based devices. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the RQL circuits. As an example, superconductors are materials that can carry a direct electrical current (DC) in the absence of an electric field. Such materials have zero resistance. As an example, at temperatures below Tc (e.g., 9.3 K), niobium is superconductive; however, at temperatures above Tc, it behaves as a normal metal with electrical resistance. Thus, in the SIS type of Josephson junctions, superconductors may be Niobium superconductors and insulators may be aluminum oxide. In SIS type junctions, the superconducting electrons are described by a quantum mechanical wavefunction. A changing phase difference in time of the phase of the superconducting electron wave-function between the two superconductors corresponds to a potential difference between the two superconductors. In RQL circuits, in one example, the SIS type junction may be part of a superconducting loop. When the time integral of the potential difference between the two superconductors is integrated with respect to time over one cycle of phase change, the magnetic flux through the loop changes by an integer multiple of a single quantum of magnetic flux. The voltage pulse associated with the single quantum of magnetic flux is referred to as a single-flux-quantum (SFQ) pulse. As an example, overdamped Josephson junctions can create individual single-flux-quantum (SFQ) pulses. In RQL circuits, each Josephson junction may be part of one or more superconducting loops. The phase difference across the junction may be modulated by the magnetic flux applied to the loop.

Various RQL circuits, including transmission lines can be formed by coupling multiple Josephson junctions by inductors or other components, as needed. SFQ pulses can travel via these transmission lines under the control of at least one clock. The SFQ pulses can be positive or negative. As an example, when a sinusoidal bias current is supplied to a junction, then both positive and negative pulses can travel rightward, during opposite clock phases, on a transmission line. The RQL circuits may advantageously have zero static power dissipation because of the absence of bias resistors. In addition, the RQL circuits may be powered using alternating current (AC) power. The AC power supply may also act as a stable clock reference signal for the RQL circuits. In one example, the digital data may be encoded using a pair of positive and negative (reciprocal) SFQ pulses. As an example, a logical one bit may be encoded as a reciprocal pair of SFQ pulses generated in the positive and negative phases of a sinusoidal clock. A logical zero bit may be encoded by the absence of positive/negative pulse pairs during a clock cycle. The positive SFQ pulse may arrive during the positive part of the clock, whereas the negative pulse may arrive during the negative part of the clock.

Microwave signals (e.g., SFQ pulses) may be used to control the state of a memory cell. During read/write operations, word-lines and bit-lines may be selectively activated by SFQ pulses arriving via an address bus. These pulses may, in turn, control word-line and bit-line drivers that may provide word-line and bit-line currents to the relevant memory cells. As an example, such a memory cell may be read out using a superconducting quantum interference device (SQUID). The memory cell may include a SQUID and a magnetic Josephson junction (MJJ) device, which may be configured such that under the application of appropriate amounts of current bias and magnetic flux, the memory cell may be in a logic '1' state or in a logic '0' state. In one example, if the memory cell is in the logic '1' state, under the application of a current via a word-line, the SQUID may transition into a "voltage state." A sense amplifier coupled to the memory cell may sense the voltage as being representative of the logic '1' state. The logic '0' state may correspond to a "substantially zero-voltage state," such that in the logic '0' state, despite the application of a current via a word-line, the SQUID may stay in the "substantially zero-voltage state." The sense amplifier may sense this as being representative of the logic '0' state.

Memory cells may be arranged in rows and columns, such that each row can be activated by a common flux bias (e.g., a read word-line signal) and each bit-line may form a transmission line that may propagate the output of the memory cells in a voltage state to a sense amplifier at one end of the column. Memory cells in a column may be serially biased by a common current source; for example, a flux pump.

In a Josephson Magnetic Random Access Memory (JM-RAM) the memory operation is based on storing information in the relative alignment of magnetic layers in a superconducting spin valve junction. The memory readout is based on the Josephson effect; as an example, the parallel or antiparallel alignment of the magnetization of the layers (fixed and free) manifests in a "0-junction" in a first state and a "pi-junction" in a second state. Alternatively, the memory readout is based on the Josephson effect; as an example, the parallel or anti-parallel alignment of the magnetization of the layers (fixed and free) manifests in a "pi-junction" in a first state and a "0-junction" in a second state. In a JMRAM, a write operation is accomplished via field-switching of a free layer relative to a fixed layer. To ensure low power operation, the JMRAMs may be required to meet certain power efficiency. The power efficiency requirements result in the switching fields being small, as an example of the order of 10 Oe. The JMRAM magnetic junction may be required to have a relatively high critical current density; as an example, Jc>20 kA/cm$^2$ may be considered acceptable.

In a magnetic Josephson junction having parameters (e.g., parameters related to the switching field and the critical current) that are consistent with power efficient operation, the Josephson effect plays a significant role in the dynamics of the magnetic switching. In particular, the Josephson effect creates a torque on the free magnetic layer that can act to change the orientation of the magnetization of the free magnetic layer. The magnitude and the direction of this torque is dependent on the superconducting phase induced across the magnetic Josephson junction. Certain example memory cells described in here use this Josephson phase-dependent torque to assist in, or induce, magnetic switching of the JMRAM bit from one state to another. As an example, this may be accomplished by embedding the magnetic Josephson junction in an RF-SQUID circuit and controlling the phase of the Josephson junction by the application of flux pulses coupled to the RF SQUID via a mutual inductance.

FIG. 1 shows a diagram of a memory cell 100 in accordance with one example. In one example, memory cell 100 may include a memory storage element 102 including at least one magnetic Josephson junction (MJJ) device 110 and at least two Josephson junctions 112 and 114 as shown in FIG. 1. In one example, each of Josephson junctions 112 and 114 may be a superconductor-insulator-superconductor (SIS) type of Josephson junction. Memory storage element 102 may further include a transformer 116. Transformer 116 may include two inductors 118 and 120. Memory storage element 102 may further include another transformer 122. Transformer 122 may include inductors 124 and 126. In one example, Josephson junctions 112 and 114 may form a readout superconducting quantum interference device (SQUID). In one example, MJJ device 110 may be a superconductor with at least two magnetic barrier layers (e.g., ferromagnetic barriers). In one example, the at least two magnetic barrier layers (e.g., ferromagnetic barriers) may be compatible with single flux quantum (SFQ) pulse-based circuits. In another example, there could be two magnetic barrier layers, with one of them having a fixed magnetic state and the other one of them having a bi-stable magnetic state. In one example, MJJ device 110 may include a non-magnetic layer sandwiched between a free magnetic layer and a fixed magnetic layer. There could be intervening layers between any of these layers. In one example, the free magnetic layer may have very soft magnetic properties to allow for switching of the magnetization direction in response to small magnetic fields. The free magnetic layer may be a ferromagnetic metal or an alloy of several magnetic and non-magnetic materials. The fixed magnetic layer may also be a metal or an alloy. In another example, the fixed magnetic layer may have a lower amount of doping than the free magnetic layer. The fixed magnetic layer may have a larger hysteresis than the hysteresis for the free magnetic layer. The thickness of the free magnetic layers may be selected to enable the transition of the MJJ device between a "zero state" and a "π state." As an example, magnetic layers may have a thickness of 10 Angstroms to 25 Angstroms. The magnetic alloy may be a Ni—Fe alloy, a Ni—Co alloy, an Fe—Co alloy, or a Co—Ni—Fe alloy. In another example, magnetic layers may include a Ni—Fe alloy doped with zirconium (Zr). In other examples, the magnetic layers may include a Ni—Fe alloy doped with molybdenum or hafnium. The non-magnetic layer may include at least one of vanadium (V), molybdenum (Mo), copper (Cu), aluminum (Al), tantalum (Ta), or chromium (Cr). Any of the layers described as part of the present disclosure may be formed using physical vapor deposition (PVD) techniques, such as sputtering. Although a certain number of layers of the MJJ device 110 arranged in a certain manner are described, there could be more or fewer layers arranged differently.

With continued reference to FIG. 1, memory cell 100 may be coupled to word-lines and bit-lines for performing various memory operations, including, for example, read and write operations. As an example, a read word-line (RWL) for performing a read operation may be coupled to memory cell 100. In this example, the read word-line (RWL) may be coupled via transformer 122. A write word-line (WWL) for performing a write operation may be coupled to memory cell 100. The write word-line may be magnetically coupled to MJJ 110. In addition, a read bit-line (RBL) for performing a read operation may be coupled to memory cell 100. A write bit-line (WBL) for performing a write operation may also be coupled to memory cell 100. In this example, the write bit-line (WBL) may be coupled via transformer 116. The inductive coupling of the write bit-line (WBL) may advantageously make the geometry of the memory cell more favorable. In this example, the flux applied via this inductive coupling to the loop (the loop formed by inductor 120 and MJJ 110) that contains MJJ 110 is being used as a control mechanism for changing the state of memory cell 100. In one example, the coupling with MJJ 110 may be such that the magnetization of the magnetic barrier layers of the MJJ can be changed by the application of a local write word-line current and by the application of a write bit-line current.

In one example, MJJ 110 may be in a first state (e.g., corresponding to a first configuration of magnetization of the at least one magnetic barrier layer) and a second state (e.g., corresponding to a second configuration of magnetization of the at least one magnetic barrier layer), where the first configuration of the magnetization may be substantially different from the second configuration of the magnetization. In one example, MJJ 110 may be in one state when the magnetization of each of the at least two magnetic barrier layers oppose each other. In one example, this state may be the "zero state" of MJJ 110. MJJ 110 may be in a different state when the magnetization of each of the at least two magnetic barrier layers support each other. In one example, this state may be the "π state." In the "π state," MJJ 110 may apply flux to JJs 112 and 114 such that under the application of a word read current, the induced currents in memory storage element 102, due to the flux generated by MJJ 110 and by the coupling of the word-read current via transformer 122, may combine with the applied bit-read current to trigger the Josephson junctions 112 and 114, sending a readout SQUID into voltage state. This voltage may generate a current along the read bit-line, which may act as a transmission line with a certain impedance. This current may be sensed using a sense amplifier.

In one example, during a write operation, the write word-line (WWL) and the write bit-line (WBL) may receive current from the respective drivers. When the magnetization of the magnetic layers support each other, then MJJ 110 may be in the "π state." Conversely, when the respective magnetization of the layers oppose each other, then MJJ 110 may be in a "zero state." In one example, the "π state" may correspond to a logic '1' state and the "zero state" may correspond to a logic '0' state of memory cell 100.

As shown in FIG. 1, MJJ 110 and inductor 120 may form a loop such that any current applied to the write-bit line results in an inductive coupling of that current into the loop. Stated differently, in this example, a flux is applied to the loop that encloses MJJ 110. The total energy density of the magnetic junction can be written as:

$$U = U_H + U_K + U_c + U_J$$

where $U_H$ is the energy associated with the applied magnetic field, including Zeeman energy and the effects of the demagnetizing fields of the two layers in the spin valve, $U_K$ describes the anisotropy energy of the magnetic layers, $U_C$ describes the coupling between the layers (e.g., magnetostatic or exchange) and $U_J$ is the Josephson energy. In this example, the torque on each of the magnetic layers can be written as $$\vec{T} = \hat{n} \times \nabla U$$

where $\hat{n}$ is a unit vector in the direction of the magnetization of the respective layer. The changes to the magnetization of the magnetic layers are then described by the Landau-Lifshitz-Gilbert equations.

The Josephson effect in the spin valve depends on the relative orientation of the magnetization in the two layers. In this example, the energy term above can be written as:

$$U_J = -\frac{E_J(m_1, m_2)}{V} \cos\delta$$

Where $E_J$ is the Josephson energy $E_J = \Phi_0 I_c/2\pi$, V is the volume of the bit, and $\delta$ is the superconducting phase difference across the junction. Further, $$E_J(m_1, m_2) = E_J^0 (\cos\varphi_1 \cos\varphi_2 - \hat{n}_1 \cdot \hat{n}_2 \sin\varphi_1 \sin\varphi_2)$$

where $\varphi_{1(2)} = \pi d_{F1(F2)}/\xi_{F1(F2)}$ relate to the evolution of the supercurrent phase inside the ferromagnetic layers, $d_{F1(F2)}$ is the thickness of the respective magnetic layers, and $\xi_{F1(F2)}$ is the oscillation period of the superconducting phase due to the exchange energy in the respective magnetic layers. If the layer thicknesses are exactly odd multiples of $\varphi_{1(2)} = \pi/2$ then the energy term can be written in spherical coordinates as $$U_J = -\eta \frac{E_J^0}{V} [\cos\theta_1 \cos\theta_2 + \sin\theta_1 \sin\theta_2 \cos(\phi_1 - \phi_2)]\cos\delta$$

where $\theta_{1,2}$ and $\phi_{1,2}$ are the polar and azimuthal angles of the magnetization vectors of the magnetic layers, and $\eta$ is equal to +1 or −1 depending on whether the parallel state results in a zero- or a pi-junction. It follows that the Josephson torque term is (written in spherical coordinates for each of the magnetic layers):

$$\vec{T} = \frac{1}{\sin\theta} \frac{\partial U_J}{\partial \phi} \hat{e}_\theta - \frac{\partial U_J}{\partial \theta} \hat{e}_\phi$$

where $$\frac{dU_j}{d\theta_1} = \eta \frac{E_j^0}{V} [\sin\theta_1 \cos\theta_2 - \cos\theta_1 \sin\theta_2 \cos(\phi_1 - \phi_2)]\cos\delta$$

-continued $$\frac{dU_j}{d\phi_1} = \eta \frac{E_j^0}{V} \sin\theta_1 \sin\theta_2 \sin(\phi_1 - \phi_2)\cos\delta$$

$$\frac{dU_j}{d\theta_2} = \eta \frac{E_j^0}{V} [\cos\theta_1 \sin\theta_2 - \sin\theta_1 \cos\theta_2 \cos(\phi_1 - \phi_2)]\cos\delta$$

$$\frac{dU_j}{d\phi_2} = -\eta \frac{E_j^0}{V} \sin\theta_1 \sin\theta_2 \sin(\phi_1 - \phi_2)\cos\delta$$

Thus, by embedding the magnetic junction in a SQUID loop and applying flux to the loop via a superconducting transformer (e.g., via transformer 116 in FIG. 1), the phase of the junction, δ in the above equations, can be controlled and can be used to effect magnetic switching. This is because the change in the phase of the junction results in a change in the Josephson energy, which in turn changes a magnitude and/or direction of the torque exerted on the magnetization of the free magnetic layer.

For reading a state of the memory cell, the change in an output voltage, current, or any other parameter of memory storage element 102 may be sensed using a sense amplifier. In one example, the presence or absence of a current pulse, once amplified by the sense amplifier, may determine the state of memory cell 100 as logic '0' or logic '1'. As an example, the logic '1' state may correspond to a "voltage state," in which a sense amplifier coupled to the memory cell may sense the voltage as being representative of the logic '1' state. The logic '0' state may correspond to a "substantially zero-voltage state," such that the sense amplifier may sense this as being representative of the logic '0' state. Although FIG. 1 shows a certain number of components arranged in a certain manner, memory cell 100 may include additional or fewer components arranged differently. As an example, although FIG. 1 shows write bit-line (WBL) coupled via an inductor, the write-word line (WWL) may instead be coupled via an inductor.

Figure 2:
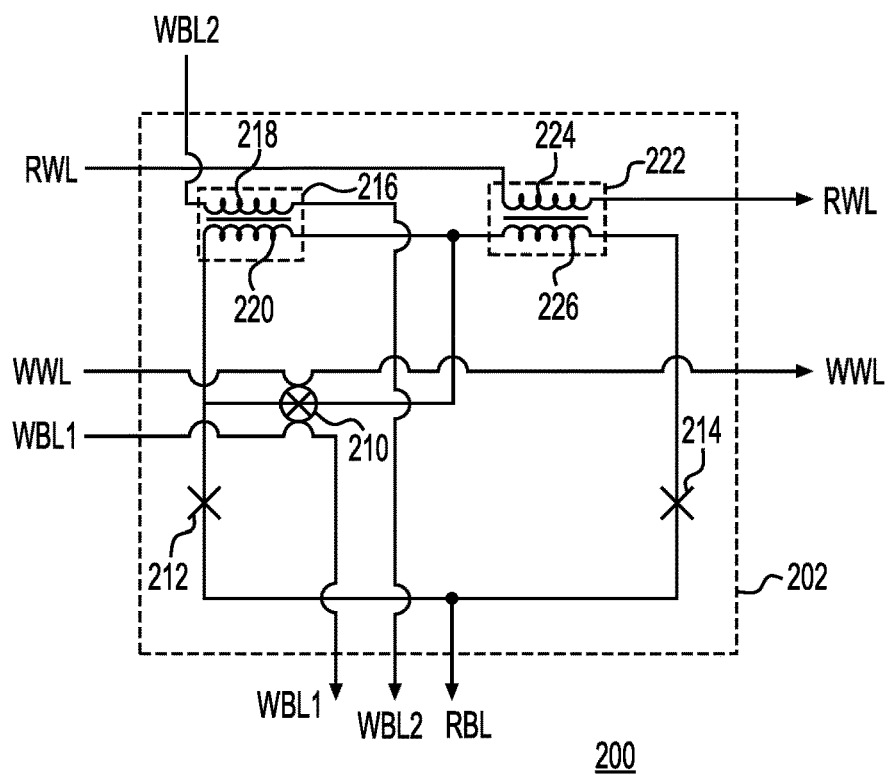
FIG. 2 shows a diagram of another memory cell in accordance with one example.

FIG. 2 shows a diagram of a memory cell 200 in accordance with another example. In one example, memory cell 200 may include a memory storage element 202 including at least one magnetic Josephson junction (MJJ) device 210 and at least two Josephson junctions 212 and 214 as shown in FIG. 2. In one example, each of Josephson junctions 212 and 214 may be a superconductor-insulator-superconductor (SIS) type of Josephson junction. Memory storage element 202 may further include a transformer 216. Transformer 216 may include two inductors 218 and 220. Memory storage element 202 may further include another transformer 222. Transformer 222 may include inductors 224 and 226. In one example, Josephson junctions 212 and 214 may form a readout superconducting quantum interference device (SQUID). In one example, MJJ device 210 may be a superconductor with at least two magnetic barrier layers (e.g., ferromagnetic barriers).

With continued reference to FIG. 2, memory cell 200 may be coupled to word-lines and bit-lines for performing various memory operations, including, for example, read and write operations. As an example, a read word-line (RWL) for performing a read operation may be coupled to memory cell 200. In this example, the read word-line (RWL) may be coupled via transformer 222. A write word-line (WWL) for performing a write operation may be coupled to memory cell 200. The write word-line may be magnetically coupled to MJJ 210. In addition, a read bit-line (RBL) for performing a read operation may be coupled to memory cell 200. Two write bit-lines (WBL1 and WBL2) for performing a write operation may also be coupled to memory cell 200. One of the write-bit lines (WBL1) may be magnetically coupled to MJJ 210 as shown in FIG. 2. In this example, the other write bit-line (WBL2) may be coupled via transformer 216. In this example, the flux applied via this inductive coupling to the loop (the loop formed by inductor 220 and MJJ 210) that contains MJJ 210 is being used as an additional control mechanism for changing the state of memory cell 200. In one example, the coupling with MJJ 210 may be such that the magnetization of the magnetic barrier layers of the MJJ can be changed by the application of a local write word-line current and by the application of write bit-line currents via WBL1 and WBL2.

In one example, MJJ 210 may be in a first state (e.g., corresponding to a first configuration of magnetization of the at least one magnetic barrier layer) and a second state (e.g., corresponding to a second configuration of magnetization of the at least one magnetic barrier layer), where the first configuration of the magnetization may be substantially different from the second configuration of the magnetization. In one example, MJJ 210 may be in one state when the magnetization of each of the at least two magnetic barrier layers oppose each other. In one example, this state may be the "zero state" of MJJ 210. MJJ 210 may be in a different state when the magnetization of each of the at least two magnetic barrier layers support each other. In one example, this state may be the "π state." In the "π state," MJJ 210 may apply flux to JJs 212 and 214 such that under the application of a word read current, the induced currents in memory storage element 202, due to the flux generated by MJJ 210 and by the coupling of the word-read current via transformer 222, may combine with a bit-read current to trigger the Josephson junctions 212 and 214, sending a readout SQUID into voltage state. This voltage may generate a current along the read bit-line, which may act as a transmission line with a certain impedance. This current may be sensed using a sense amplifier.

In one example, during a write operation, the write word-line (WWL) and the write bit-lines (WBL1 and WBL2) may receive current from the respective drivers. When the magnetization of the magnetic layers support each other, then MJJ 210 may be in the "π state." Conversely, when the respective magnetization of the layers oppose each other, then MJJ 120 may be in a "zero state." In one example, the "π state" may correspond a logic '1' state and the "zero state" may correspond to a logic '0' state of memory cell 200.

Figure 3:
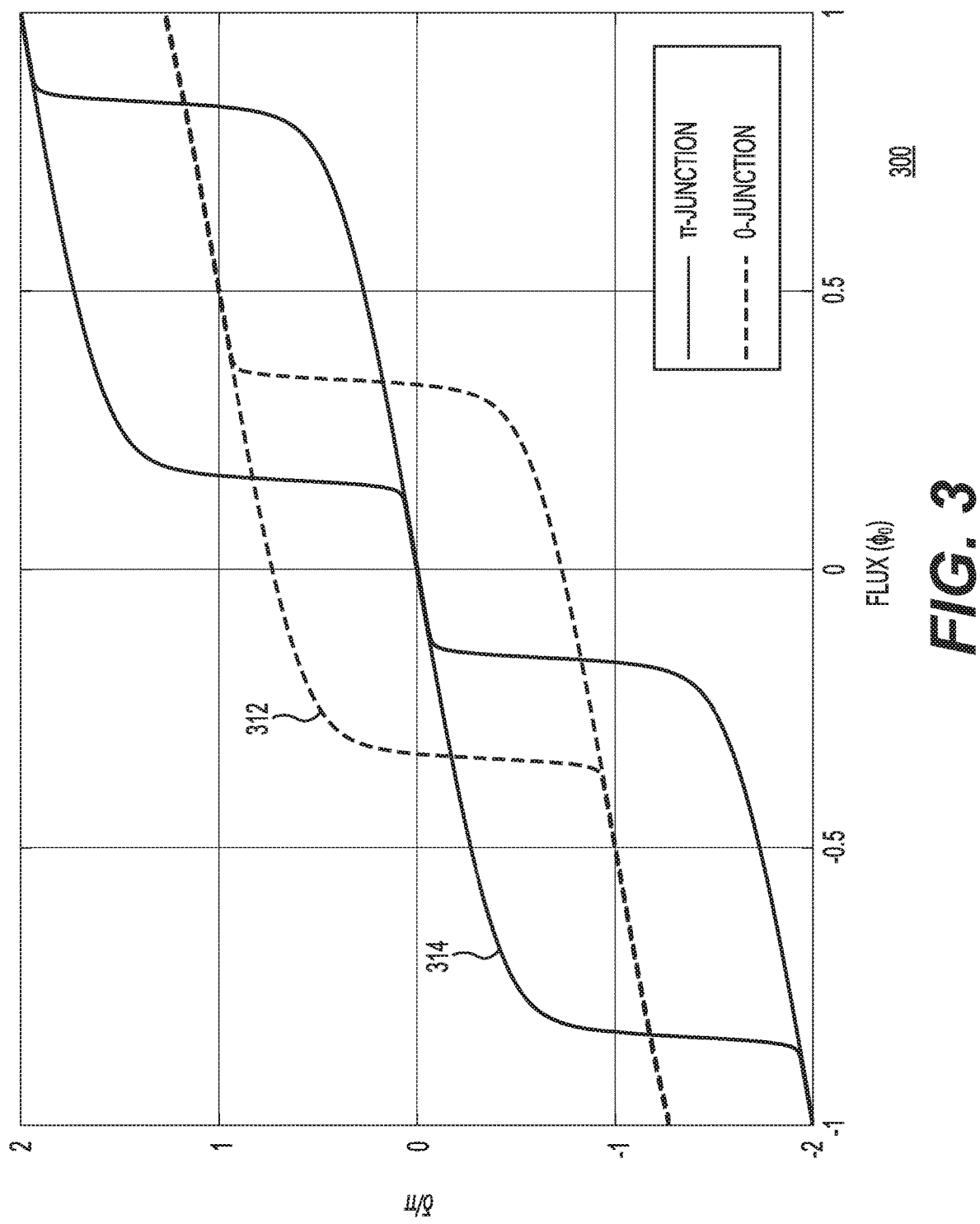
FIG. 3 is a graph depicting a relationship between the superconducting phase of an MJJ corresponding to a memory cell and the applied flux to the SQUID in the memory cell in accordance with one example.

FIG. 3 is a graph 300 depicting a relationship between the junction phase of an MJJ (e.g., MJJ 110 or MJJ 210) corresponding to a memory cell and the applied flux to the SQUID in the memory cell in accordance with one example. In this example, the applied flux ($\phi_0$) is shown along the horizontal axis of graph 300 and the change in the junction phase ($\delta/\pi$) of the MJJ is shown along the vertical axis. The graph shows the change in the junction phase for both a 0-junction (dotted lines 312) and a π-junction (solid lines 314). The SQUID becomes bi-stable around a phase of $\phi_0/2$ for the 0-junction and around a phase of 0 for the π-junction.

Figure 4B:
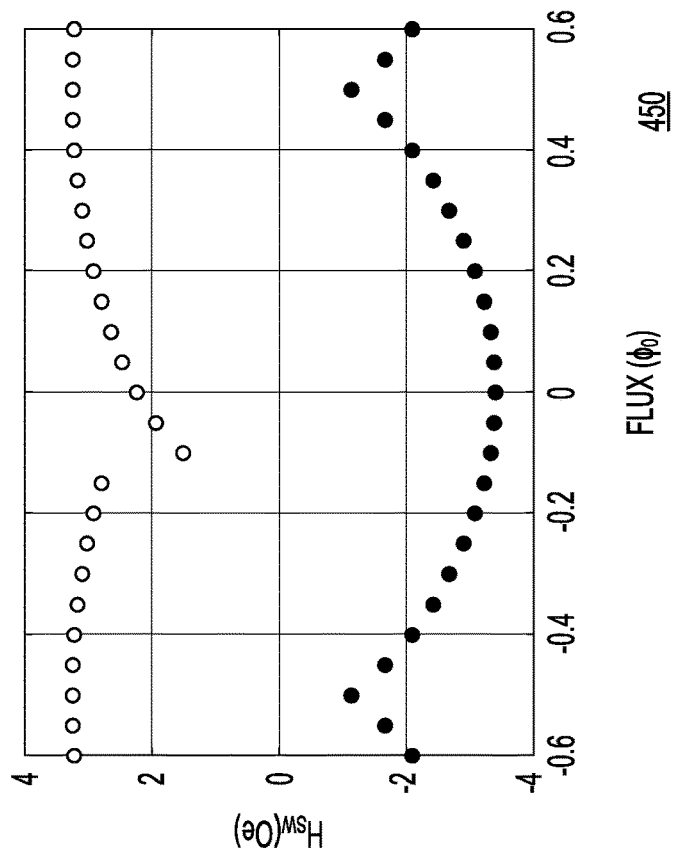
FIGS. 4A and 4B show graphs depicting a relationship between a switching field of an MJJ corresponding to a memory cell and the applied flux to the SQUID in the memory cell in accordance with one example.
Figure 4A:
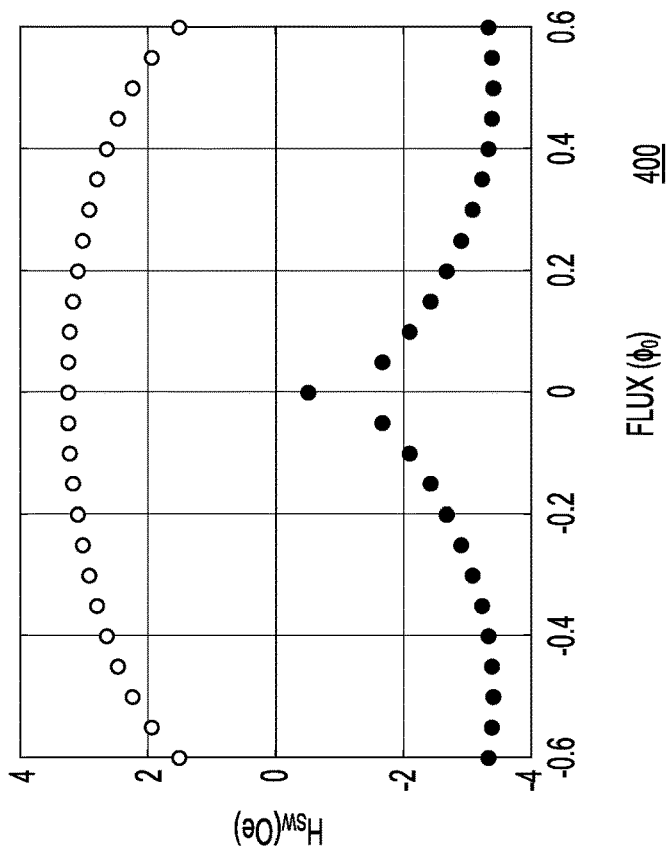

FIG. 4A shows a graph 400 and FIG. 4B shows a graph 450 depicting a relationship between a switching field ($H_{SW}$) of an MJJ corresponding to a memory cell and the applied flux ($\phi_0$) to the SQUID in the memory cell in accordance with one example. Graph 400 shows the relationship for a junction that is a 0-junction when the magnetization of both the free layer and the fixed layer is parallel to each other and graph 450 shows the relationship for a junction that is a π-junction when the magnetization of both the free layer and the fixed layer is parallel to each other. As shown in both graphs 400 and 450, in this example, the applied flux (e.g., applied via a write bit-line inductively coupled to the loop) to the junction not only changes the width of the switching loop, but also changes its center.

Figure 5B:
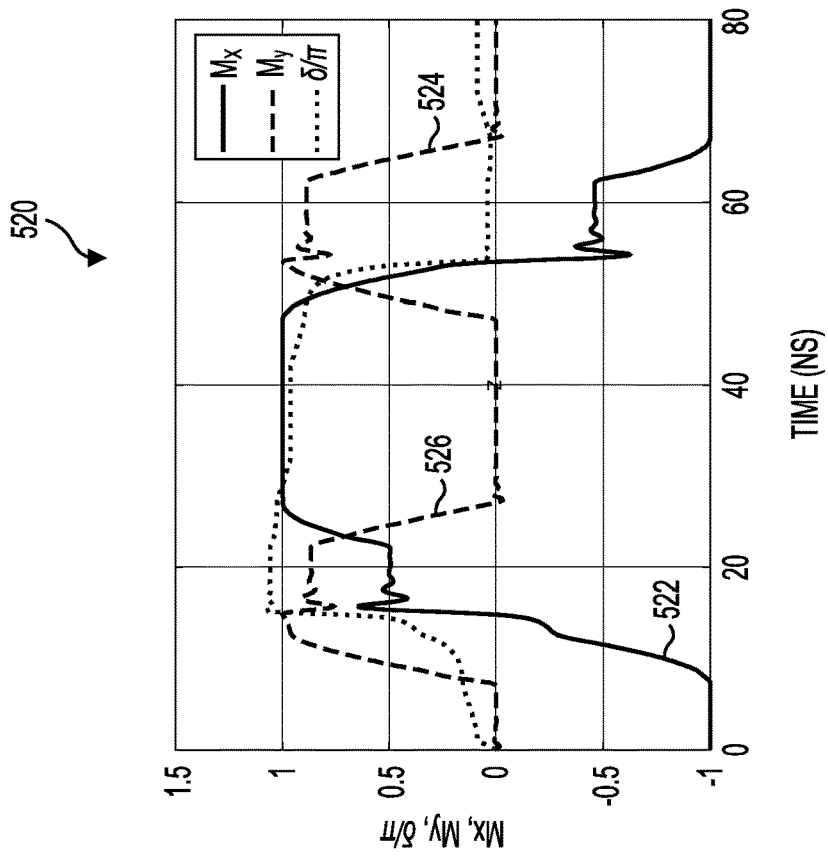
FIGS. 5A-C show simulated switching of the magnetization of an MJJ corresponding to a memory cell based on an application of flux via a write word-line and a write bit-line and the effect on the critical current of the MJJ in accordance with one example.
Figure 5A:
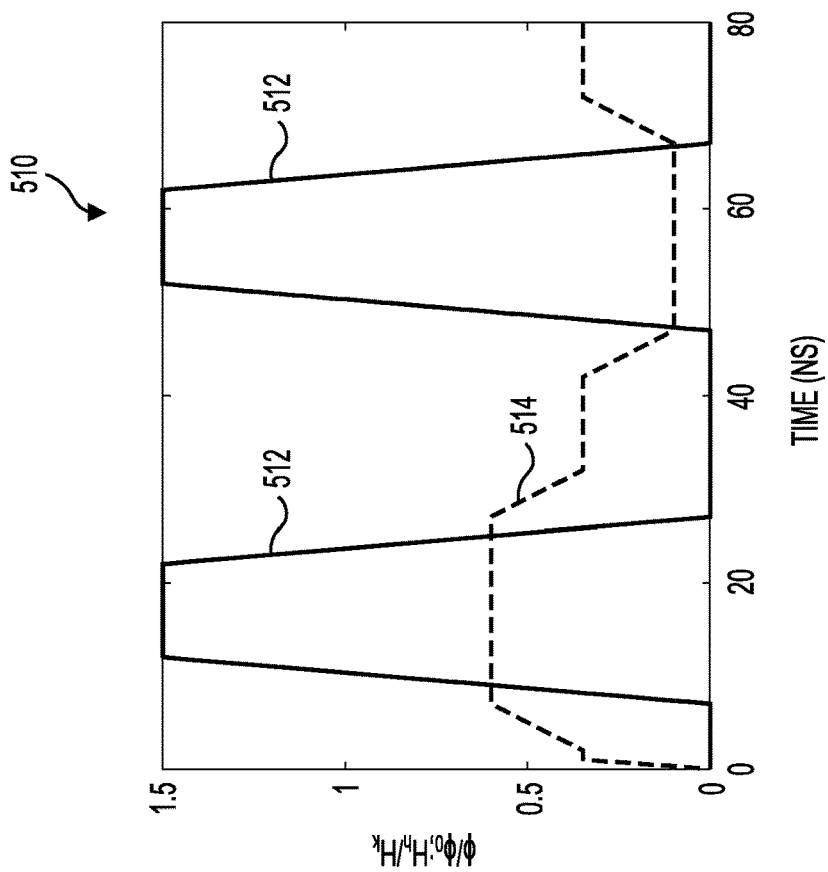
Figure 5C:
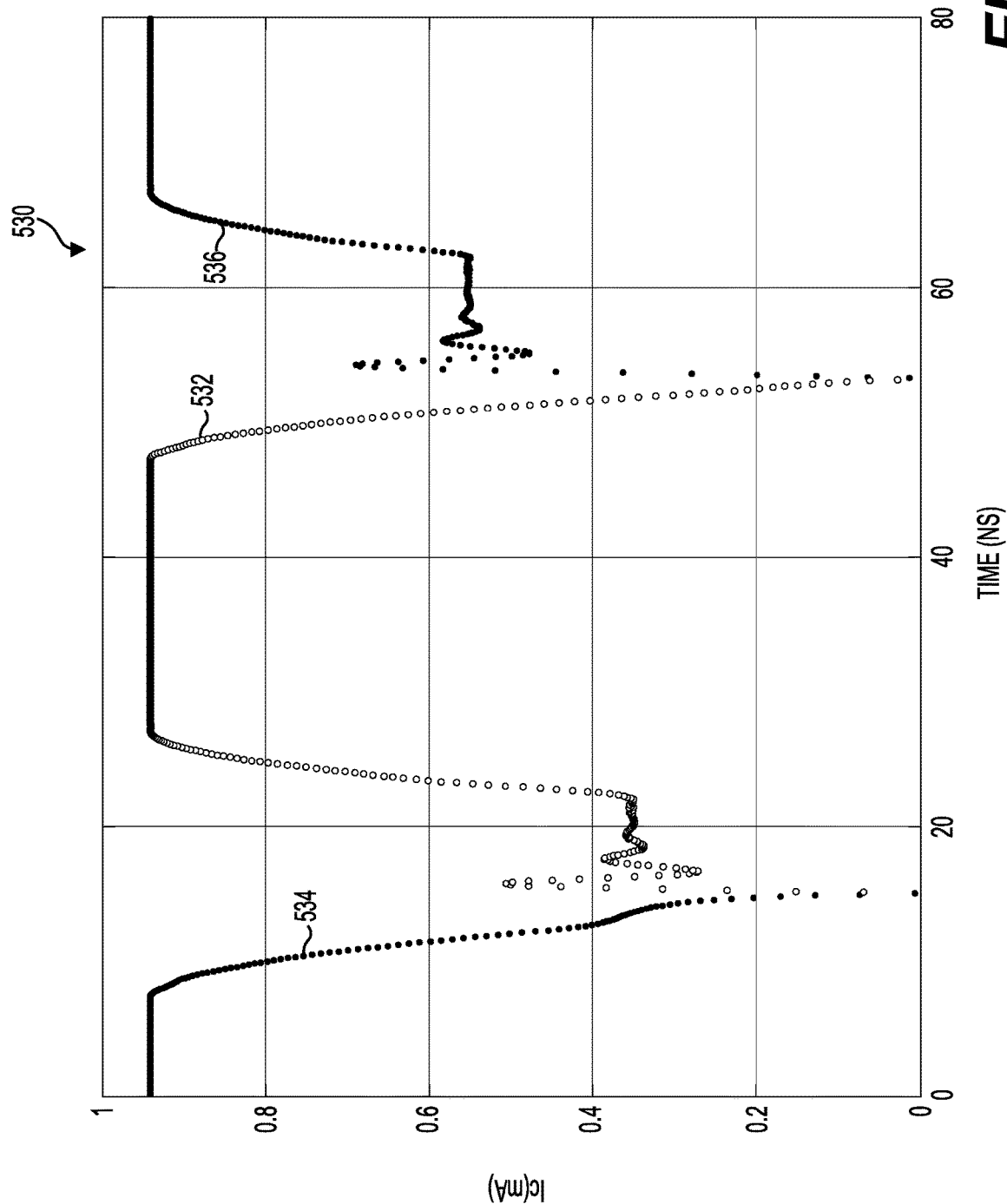

FIGS. 5A-C show simulated switching of the magnetization of an MJJ corresponding to a memory cell based on an application of flux via a write word-line and a write bit-line and the effect on the critical current flowing through the MJJ in accordance with one example. In this example, the junction in the MJJ is in the 0-state when the magnetization of the free layer is parallel to the magnetization of the fixed layer. Panel 510 shows the profile of the write signals applied to the memory cell. The solid lines 512 in panel 510 show the write pulse applied via a write word-line to the MJJ (as a function of time) in response to an application of the current via the write word line. The dotted lines 514 in panel 510 show the application of flux induced in the MJJ (as a function of time) as a result of the application of the current via the write bit-line that is inductively coupled to the loop including the MJJ. The curve 526 in panel 520 (FIG. 5B) shows the changes in the junction phase of the MJJ during the same time duration as in panel 510. The curve 522 in panel 520 shows the changes in the easy axis magnetization ($M_x$) of the free layer of the MJJ during the same time duration as in panel 510. The curve 524 shows the changes in the hard axis magnetization ($M_y$) of the free layer of the MJJ during the same time duration as in panel 510. In this example, in response to an application of a word-write pulse in conjunction with the flux pulse (applied via the write-bit line), the easy axis magnetization ($M_x$) switches controllably from $M_x=-1$ (parallel alignment of the magnetization of the free layer and the fixed layer) to $M_x=+1$ (anti-parallel alignment of the magnetization of the free layer and the fixed layer) and then back to $M_x=-1$. Panel 530 (FIG. 5C) shows time-domain evolution of the critical current of the MJJ during the same time duration as in panel 510. The curve 532 shows the critical current when the junction is in the 0-state and the curves 534 and 536 show the critical current when the junction is in the π-state.

Figure 6B:
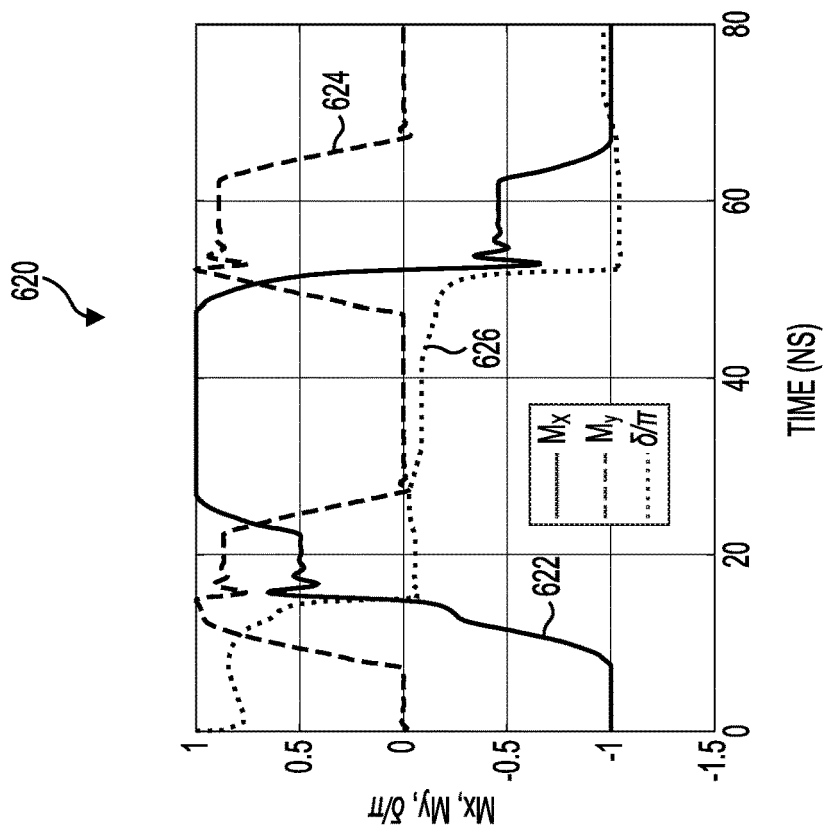
FIGS. 6A-C show simulated switching of the magnetization of an MJJ corresponding to a memory cell based on an application of flux via a write word-line and a write bit-line and the effect on the critical current of the MJJ in accordance with another example.
Figure 6A:
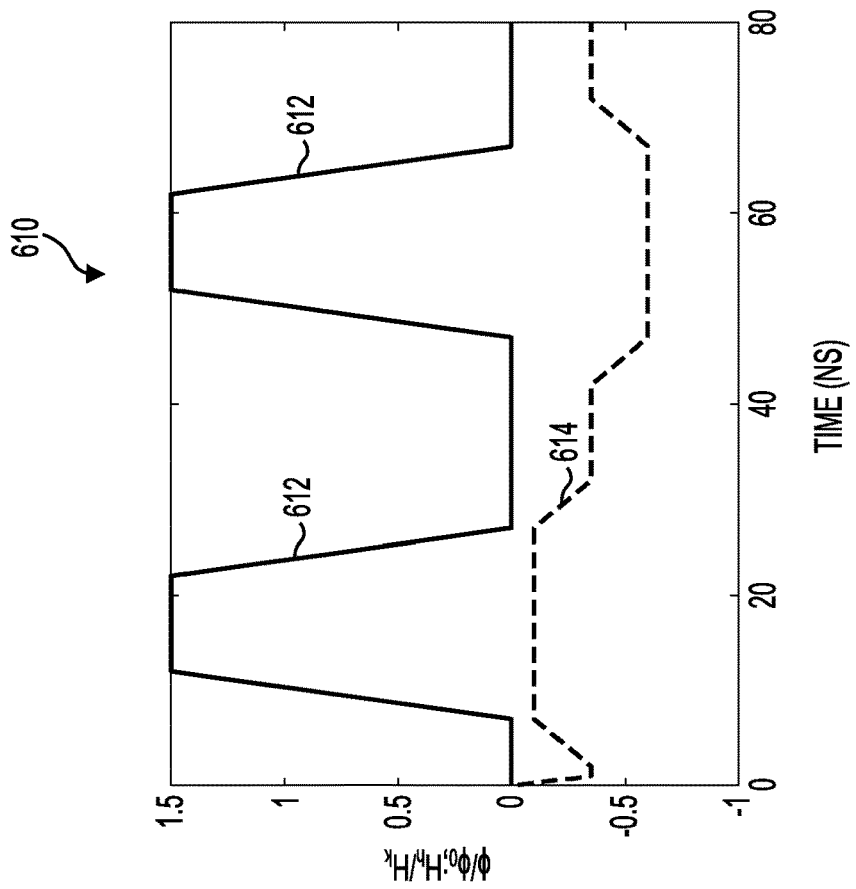
Figure 6C:
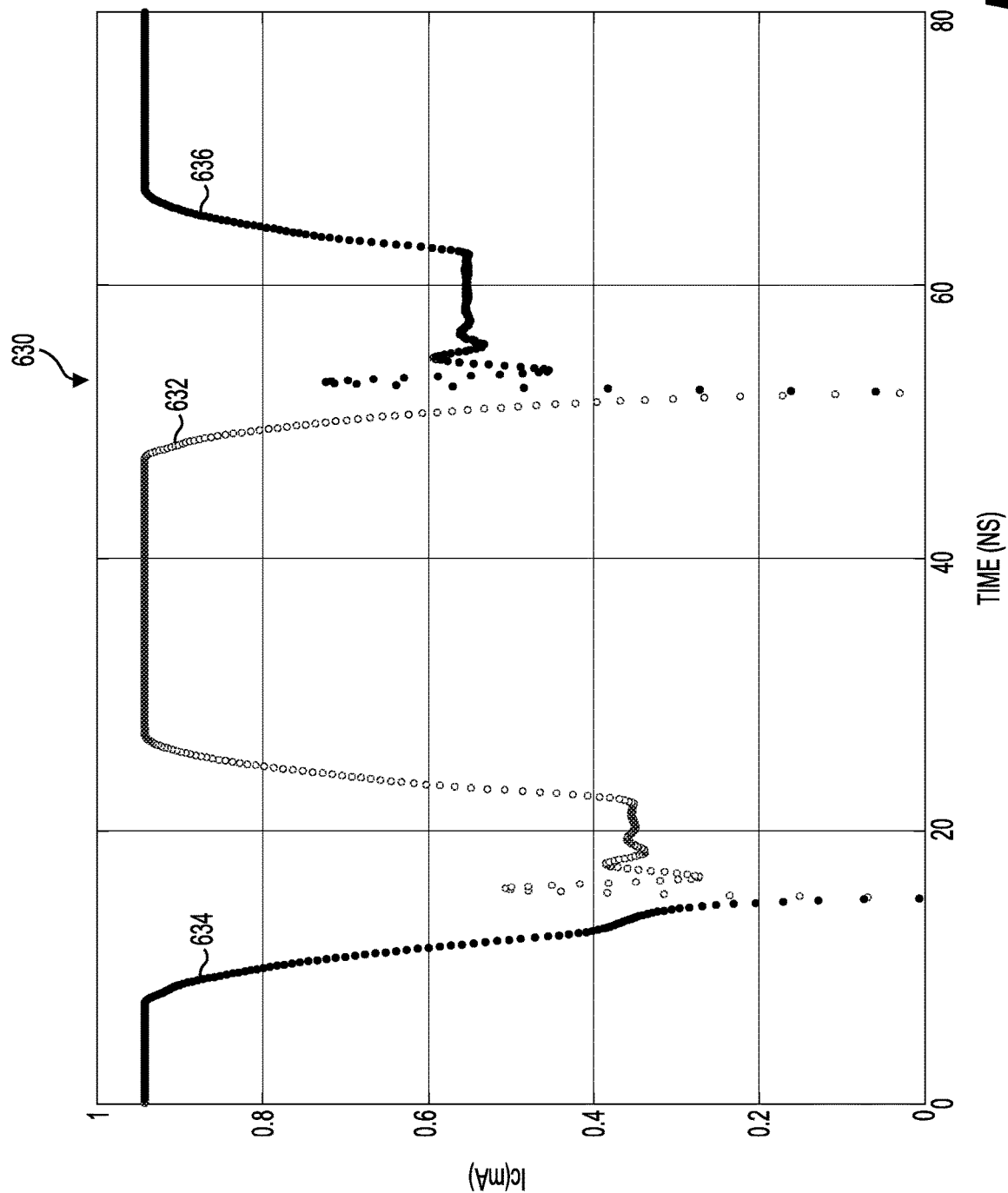

FIGS. 6A-C show simulated switching of the magnetization of an MJJ corresponding to a memory cell based on an application of flux via a write word-line and a write bit-line and the effect on the critical current flowing through the MJJ in accordance with another example. In this example, the junction in the MJJ is in the π-state when the magnetization of the free layer is parallel to the magnetization of the fixed layer. Panel 610 shows the profile of the write signals applied to the memory cell. The solid lines 612 in panel 610 show the write pulse applied via a write word-line to the MJJ (as a function of time) in response to an application of the current via the write word line. The dotted lines 614 in panel 610 show the application of flux induced in the MJJ (as a function of time) as a result of the application of the current via the write bit-line that is inductively coupled to the loop including the MJJ. The curve 626 in panel 620 (FIG. 6B) shows the changes in the junction phase of the MJJ during the same time duration as in panel 610. The curve 622 in panel 620 shows the changes in the easy axis magnetization ($M_x$) of the free layer of the MJJ during the same time duration as in panel 610. The curve 624 shows the changes in the hard axis magnetization ($M_y$) of the free layer of the MJJ during the same time duration as in panel 610. In this example, in response to an application of a word-write pulse in conjunction with the flux pulse (applied via the write-bit line), the easy axis magnetization ($M_x$) switches controllably from $M_x=-1$ (parallel alignment of the magnetization of the free layer and the fixed layer) to $M_x=+1$ (anti-parallel alignment of the magnetization of the free layer and the fixed layer) and then back to $M_x=-1$. Panel 630 (FIG. 6C) shows time-domain evolution of the critical current flowing through the MJJ during the same time duration as in panel 610. The curve 632 shows the critical current when the junction is in the 0-state and the curves 634 and 636 show the critical current when the junction is in the π-state.

Figure 7:
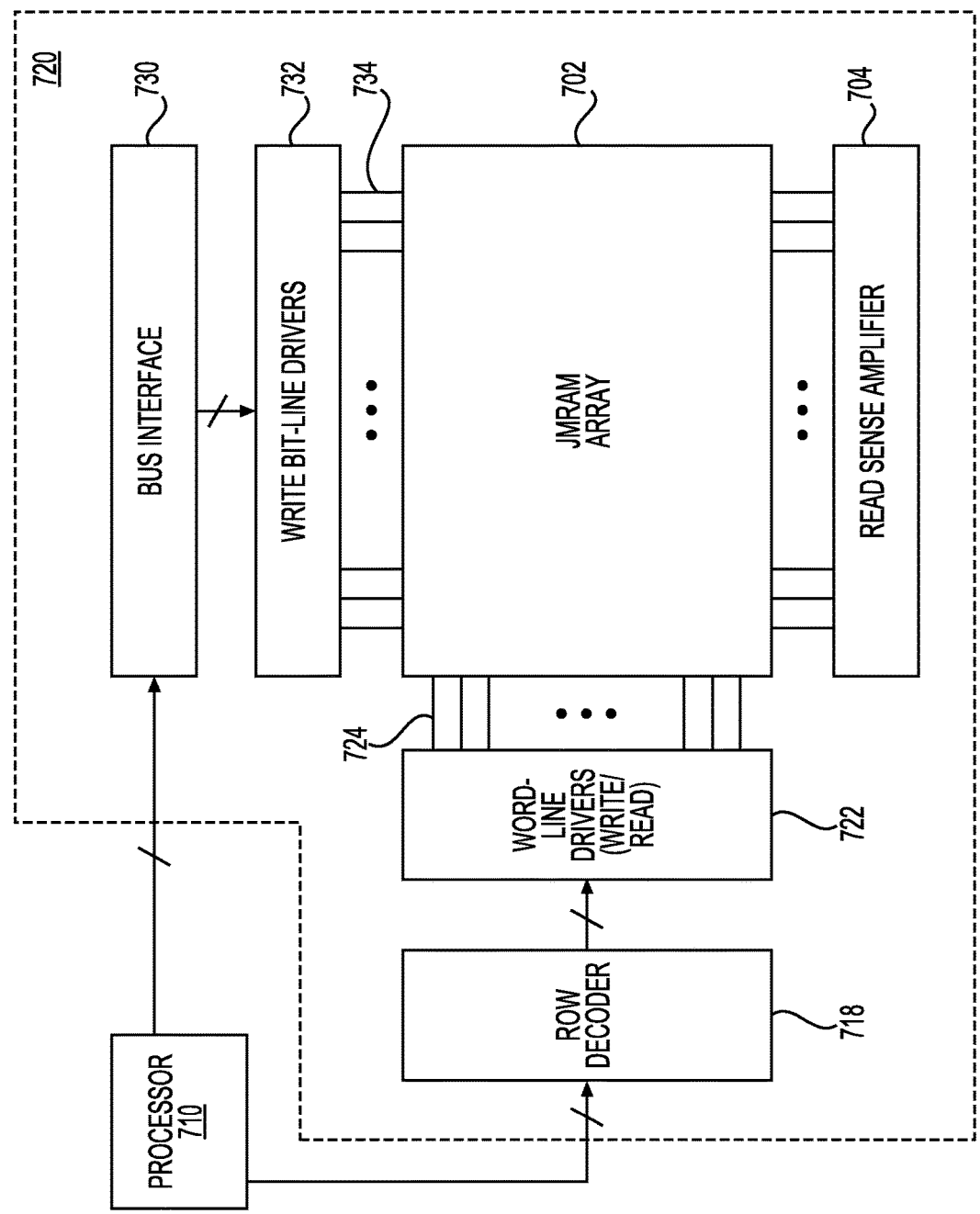
FIG. 7 shows a computing system including a memory, coupled to a processor, in accordance with one example.

FIG. 7 shows a computing system including a memory, coupled to a processor, in accordance with one example. FIG. 7 shows a computing system 700 including a processor 710 coupled to a memory 720 in accordance with one example. Processor 710 may perform read or write operations on memory 720 in a manner as explained earlier. Additionally, processor 710 and memory 720 may be used along with other superconducting logic based devices. In general, any superconducting device operating in cryogenic environments and requiring storage of instructions or data may include memory 720. Furthermore, processor 710 need not be in a cryogenic environment; instead, it may operate at non-cryogenic temperatures. In this example, memory 720 may be in a separate cryogenic environment and may be coupled via connectors to processor 710 in a way that the cryogenic environment can be maintained. Memory 720 may be used as part of storage in a data center for delivering cloud-based services, such as software as a service, platform as a service, or other services. Memory system 720 may include an array 702 of memory cells arranged in rows and columns. In one example, array 702 may be an array of memory cells, e.g., memory cells 100 and 200 shown earlier. Memory system 720 may further include a row decoder 718 that may be configured to decode row control/address signals. Row decoder 718 may further be coupled to word-line drivers 722. Word-line drivers 722 may include circuitry to provide word-line read/write current to a subset or all of the memory cells associated with a selected word-line for any read or write operations. Word-line drivers 722 may provide such current via word-lines 724.

Memory system 720 may further include bus interface 730 that may be configured to receive control signals or other signals from processor 710. Bus interface 730 may further be coupled to bit-line drivers 732. Bit-line drivers 732 may include circuitry to provide bit-line read current to a subset or all of the memory cells associated with a selected bit-line for any read or write operations. Bit-line drivers 732 may provide such current via bit-lines 734. Bit-lines 734 may include both read bit-lines and write bit-lines. In other words, different bit-lines may be used to provide current to the selected memory cells for read or write operations. By using row and column addresses, any of the memory cells could be accessed using an address. Each of the bit-lines (e.g., bit-lines 734) may further be coupled to sense amplifier 704 for sensing bit-lines to determine the logical state of each of the array 702 of memory cells.

The coupling between the array 702 of memory cells and sense amplifier 704 may include radio frequency (RF) transmission lines. The memory cells in each column may be serially current-biased by a common current source (e.g., a flux pump). As described earlier, bit-lines 734 may be used to couple this current to each of the memory cells in a column. Although FIG. 7 shows a certain number of components of computing system 700 arranged in a certain manner, there could be more or fewer number of components arranged differently.

In conclusion, the present disclosure relates to a memory cell including a first inductor and a magnetic Josephson junction (MJJ) coupled to the first inductor to form a loop. The MJJ may include at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second state corresponds to a second configuration of magnetization of the free magnetic layer, where the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and where the memory cell is configured to switch from the first state of the memory cell to the second state of the memory cell responsive to a current flowing through the MJJ based on whether the MJJ is in a zero-state or a π-state, where the current flowing through the MJJ is configured to exert a torque on the magnetization of the free magnetic layer to cause the switch from the first state of the memory cell to the second state of the memory cell, and where the current is produced in response to an application of flux to the loop via the first inductor.

The first inductor may be inductively coupled to a write bit-line. The write bit-line may be configured to receive a write current as part of a write operation associated with the memory cell. The MJJ may be magnetically coupled to a write word-line.

The current flowing through the MJJ may be configured to exert the torque on the magnetization of the free magnetic layer caused by a change in a superconducting phase of the MJJ from the zero-state to the π-state. The memory cell may be configured to switch from the first state of the memory cell to the second state of the memory cell responsive to an exertion of the torque on the magnetization of the free magnetic layer. A magnitude of the torque and a direction of the torque may be dependent upon the superconducting phase of the MJJ.

In another aspect, a method in a memory cell including a first inductor and a magnetic Josephson junction (MJJ) connected to the first inductor to form a loop, where the MJJ comprises at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second state corresponds to a second configuration of magnetization of the free magnetic layer, where the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer is provided. The method may include receiving a write pulse via a write-bit line. The method may further include in response to a current flowing through the MJJ, switching from the first state of the memory cell to the second state of the memory cell based on whether the MJJ is in a zero-state or a π-state, where the current flowing through the MJJ is configured to exert a torque on the magnetization of the free magnetic layer to cause the switching from the first state of the memory cell to the second state of the memory cell, and where the current is produced in response to an application of flux to the loop via the first inductor.

The first inductor may be inductively coupled to a write bit-line. The write bit-line may be configured to receive a write current as part of a write operation associated with the memory cell. The MJJ may be magnetically coupled to a write word-line.

The current flowing through the MJJ may be configured to exert the torque on the magnetization of the free magnetic layer caused by a change in a superconducting phase of the MJJ from the zero-state to the π-state. The memory cell may be configured to switch from the first state of the memory cell to the second state of the memory cell responsive to an exertion of the torque on the magnetization of the free magnetic layer. A magnitude of the torque and a direction of the torque may be dependent upon the superconducting phase of the MJJ.

In yet another aspect, the present disclosure relates to a memory cell including a first inductor and a magnetic Josephson junction (MJJ) coupled to the first inductor to form a loop. The MJJ may include at least a first layer formed above a second layer and a third layer formed below the second layer, where the first layer is a free magnetic layer, the second layer is a non-magnetic layer, where the third layer is a fixed magnetic layer, where the memory cell is configured to be in a first state or a second state, and where the first state corresponds to a first configuration of magnetization of the free magnetic layer and the second state corresponds to a second configuration of magnetization of the free magnetic layer, where the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and where the memory cell is configured to switch from the first state of the memory cell to the second state of the memory cell based on a torque exerted on the magnetization of the free magnetic layer responsive to whether the MJJ is in a zero-state or a π-state.

The memory cell may further include a first inductor, where the first inductor is inductively coupled to a write bit-line. The first inductor may be inductively coupled to a write bit-line. The write bit-line may be configured to receive a write current as part of a write operation associated with the memory cell. The MJJ may be magnetically coupled to a write word-line.

The torque may be exerted on the magnetization of the free magnetic layer because of a change in a superconducting phase of the MJJ. The magnitude of the torque and a direction of the torque is dependent upon the superconducting phase of the MJJ.

It is to be understood that the methods, modules, and components depicted herein are merely exemplary. Alternatively, or in addition, the functionally described herein can be performed, at least in part, by one or more hardware logic components. For example, and without limitation, illustrative types of hardware logic components that can be used include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

The functionality associated with the examples described in this disclosure can also include instructions stored in a non-transitory media. The term "non-transitory media" as used herein refers to any media storing data and/or instructions that cause a machine, such as processor 710, to operate in a specific manner. Exemplary non-transitory media include non-volatile media and/or volatile media. Non-volatile media include, for example, a hard disk, a solid state drive, a magnetic disk or tape, an optical disk or tape, a flash memory, an EPROM, NVRAM, PRAM, or other such media, or networked versions of such media. Volatile media include, for example, dynamic memory, such as, DRAM, SRAM, a cache, or other such media. Non-transitory media is distinct from, but can be used in conjunction with transmission media. Transmission media is used for transferring data and/or instruction to or from a machine. Exemplary transmission media, include coaxial cables, fiber-optic cables, copper wires, and wireless media, such as radio waves.

Furthermore, those skilled in the art will recognize that boundaries between the functionality of the above described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate spatial, temporal, or other prioritization of such elements.

What is claimed:

1. A memory cell comprising:
a first inductor; and
a magnetic Josephson junction (MJJ) coupled to the first inductor to form a loop, wherein the MJJ comprises at least a first layer formed above a second layer and a third layer formed below the second layer, wherein the first layer is a free magnetic layer, the second layer is a non-magnetic layer, wherein the third layer is a fixed magnetic layer, wherein the memory cell is configured to be in a first state or a second state, and wherein the first state corresponds to a first configuration of magnetization of the free magnetic layer and the second state corresponds to a second configuration of magnetization of the free magnetic layer; wherein the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and wherein the memory cell is configured to switch from the first state of the memory cell to the second state of the memory cell responsive to a current flowing through the MJJ based on whether the MJJ is in a zero-state or a π-state, wherein in response to a change in a superconducting phase of the MJJ from the zero-state to the π-state, the current flowing through the MJJ is configured to exert a Josephson-phase-dependent torque on the magnetization of the free magnetic layer to cause the switch from the first state of the memory cell to the second state of the memory cell, and wherein the current is produced in response to an application of flux to the loop via the first inductor.

2. The memory cell of claim 1, wherein the first inductor is inductively coupled to a write bit-line.

3. The memory cell of claim 2, wherein the write bit-line is configured to receive a write current as part of a write operation associated with the memory cell.

4. The memory cell of claim 2, wherein the MJJ is magnetically coupled to a write word-line.

5. The memory cell of claim 1, wherein a magnitude of the Josephson-phase-dependent torque and a direction of the Josephson-phase-dependent torque is dependent upon the superconducting phase of the MJJ.

6. The memory cell of claim 1, wherein the memory cell is configured to switch from the first state of the memory cell to the second state of the memory cell responsive to an exertion of the Josephson-phase-dependent torque on the magnetization of the free magnetic layer.

7. A method in a memory cell comprising a first inductor and a magnetic Josephson junction (MJJ) coupled to the first inductor to form a loop, wherein the MJJ comprises at least a first layer formed above a second layer and a third layer formed below the second layer, wherein the first layer is a free magnetic layer, the second layer is a non-magnetic layer, wherein the third layer is a fixed magnetic layer, wherein the memory cell is configured to be in a first state or a second state, and wherein the first state corresponds to a first configuration of magnetization of the free magnetic layer and the second state corresponds to a second configuration of magnetization of the free magnetic layer, wherein the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, the method comprising:
receiving a write pulse via a write-bit line; and
in response to a current flowing through the MJJ, switching from the first state of the memory cell to the second state of the memory cell based on whether the MJJ is in a zero-state or a π-state, wherein in response to a change in a superconducting phase of the MJJ from the zero-state to the π-state, the current flowing through the MJJ is configured to exert a Josephson-phase-dependent torque on the magnetization of the free magnetic layer to cause the switching from the first state of the memory cell to the second state of the memory cell, and wherein the current is produced in response to an application of flux to the loop via the first inductor.

8. The method of claim 7, wherein the first inductor is inductively coupled to a write bit-line.

9. The method of claim 8, wherein the write bit-line is configured to receive a write current as part of a write operation associated with the memory cell.

10. The method of claim 8, wherein the MJJ is magnetically coupled to a write word-line.

11. The method of claim 7, wherein a magnitude of the Josephson-phase-dependent torque and a direction of the Josephson-phase-dependent torque is dependent upon the superconducting phase of the MJJ.

12. The method of claim 7, wherein the memory cell is configured to switch from the first state of the memory cell to the second state of the memory cell responsive to an exertion of the Josephson-phase-dependent torque on the magnetization of the free magnetic layer.

13. A memory cell comprising:
a magnetic Josephson junction (MJJ) comprising at least a first layer formed above a second layer and a third layer formed below the second layer, wherein the first layer is a free magnetic layer, the second layer is a non-magnetic layer, wherein the third layer is a fixed magnetic layer, wherein the memory cell is configured to be in a first state or a second state, and wherein the first state corresponds to a first configuration of magnetization of the free magnetic layer and the second state corresponds to a second configuration of magnetization of the free magnetic layer, wherein the first configuration of the magnetization of the free magnetic layer corresponds to a first magnetization that is parallel to a magnetization of the fixed magnetic layer and the second configuration of the magnetization of the free magnetic layer corresponds to a second magnetization that is anti-parallel to the magnetization of the fixed magnetic layer, and wherein the memory cell is configured to switch from the first state of the memory cell to the second state of the memory cell based on a Josephson-phase-dependent torque exerted on the magnetization of the free magnetic layer responsive to whether the MJJ is in a zero-state or a π-state.

14. The memory cell of claim 13, wherein the MJJ is coupled to a first inductor to form a loop and wherein the first inductor is inductively coupled to a write bit-line.

15. The memory cell of claim 14, wherein the write bit-line is configured to receive a write current as part of a write operation associated with the memory cell.

16. The memory cell of claim 14, wherein the MJJ is magnetically coupled to a write word-line.

17. The memory cell of claim 13, wherein the Josephson-phase-dependent torque is exerted on the magnetization of the free magnetic layer because of a change in a superconducting phase of the MJJ.

18. The memory cell of claim 17, wherein a magnitude of the Josephson-phase-dependent torque and a direction of the Josephson-phase-dependent torque is dependent upon the superconducting phase of the MJJ.

* * * * *